United States Patent Office 3,806,362 Patented Apr. 23, 1974

3,806,362
COATING FOR THERMOELECTRIC MATERIALS

Edward L. Reed, Woodland Hills, and Irwin J. Groce, Canoga Park, Calif., assignors to Rockwell International Corporation No Drawing. Filed June 30, 1966, Ser. No. 562,948
Int. Cl. B44d *1/18*; C03c *5/02*
U.S. Cl. 117—221 9 Claims

ABSTRACT OF THE DISCLOSURE

A lead telluride thermoelectric material is protected by a coating formed of an enamel which contains as essential components, lead oxide, silica, lithium oxide and either sodium or potassium oxide.

The invention described herein was made in the course of, or under, a contract with the U.S. Atomic Energy Commission.

The present invention relates to a protective ceramic composition of matter, and more particularly to a composition and method for protecting thermoelectric elements.

Thermoelectric materials have the ability to convert heat directly to electricity without conventional rotating machinery, which makes the use of such materials highly desirable for remote and space applications. This is particularly the case where the power and life requirements are such as to make the use of batteries or solar cells less attractive due to higher power-to-weight ratios and to other undesirable characteristics thereof under stringent environmental conditions. Thermoelectric materials are well known to the art and include such materials as germanium-silicon, zinc-antimony, copper-silver-selenium, bismuth telluride, lead telluride, germanium-bismuth telluride, tin telluride, managanese telluride, lead sulfide, and Chromel-constantan.

A thermoelectric converter assembly customarily consists of the thermoelectric material, alternately doped with n-type and p-type dopants in the case of semiconductors, with electrical contacts joined thereto. One side of the element is connected to a hot junction in communication with a heat source, and the other side to a cold junction such as an environmental radiator which serves as a heat sink. The temperature differential impressed across the element generates a voltage, in accordance with the Seebeck effect.

Certain characteristics of the thermoelectric materials pose difficulties for their use in space or other severe environmental conditions, for example at temperatures upward of 900° F. under vacuum. Principal among these characteristics is the tendency of thermoelectric materials, especially lead telluride and also bismuth and arsenic-containing semiconductors, to sublimate under such conditions, thereby resulting in either severe degradation or loss of electrical properties.

Various encapsulating methods have been employed, with varying degrees of success, to prevent sublimation while not degrading thermal or electrical properties of the material. It is considered that a satisfactory encapsulant is one that would not cause greater than a 5 percent heat shunt or a 1 percent electrical shunt through the encapsulation material; it would also protect the thermoelectric material for about 10,000 hours of operation before reaching a 5 percent sublimation loss.

Among the encapsulating methods which have been tried are plasma flame spraying of ceramics, metal sleeves, vapor deposition of ceramics, electrophoretic deposition of ceramics, and coating with heat-cured cements. All of these have drawbacks in one or more respects, including inability to meet thermal and electrical shunt standards, cracking, poisoning of thermoelectric materials, and failure to prevent sublimation of the thermoelectric material. In particular, enamel encapsulants, which have received considerable attention, have poor adhesion characteristics and a tendency to crack or spall at temperature. This is caused by the relatively poor thermal expansion characteristics of the vitreous enamels in comparison with the very high thermal expansion rates of semiconductor materials; the resulting mismatch of thermal expansion characteristics contributes to the cracking.

The principal object of the present invention, accordingly, is to provide an improved composition and method for the protection of thermoelectric elements.

Another object is to provide an improved composition and method for preventing sublimation of thermoelectric materials at high temperature under vacuum.

Another object is to provide a ceramic encapsulant for thermoelectric elements having good adherence characteristics and a high thermal expansion coefficient, which will greatly minimize sublimation of the elements under severe environmental conditions.

Still another object is to provide such a composition which will not degrade the thermal or electrical properties of the thermoelectric material.

A further object is to provide a convenient and reliable method for the application and formation of a protective ceramic coating on a thermoelectric material at temperatures below those which would be destructive of the thermoelectric properties of the material or which would cause vaporization thereof.

The foregoing and other objects and advantages of the present invention will become apparent from the following detailed description and the appended claims.

In accordance with the present invention there is provided an improved protective coating for thermoelectric materials which comprises a dispersion of a metal oxide in an enamel, the dispersed metal oxide and enamel having relatively high thermal expansion coefficients. The enamel forms a continuous matrix around the dispersed grains of the aforesaid oxide. It also diffuses into the grains of the hard, high expansion oxide, and the resulting protective coating after firing has a crystalline appearance, is impervious, and will protect the thermoelectric material for at least 10,000 hours at 900° F. under vacuum with less than 5 percent sublimation loss.

It is essential that the metal oxide dispersant have a relatively high thermal coefficient of expansion, which corresponds reasonably well with that of the high-expansion thermoelectric materials. The dispersed metal oxide generally should thus have a linear coefficient of expansion of at least about 10 in./in./° C.($\times 10^{-6}$). For example, lead telluride, for which the present coating is particularly effective, has a linear coefficient of expansion of 20–22 in./in./° C.($\times 10^{-6}$), whereas the value for porcelain is 6.0 and for glass is 3.2–6.7. In contrast, $Li_2TiO_3$, one of the preferred dispersant metal oxides in the present coating composition, has a linear coefficient of expansion of 18.1 in./in./° C.($\times 10^{-6}$).

The general designation of the dispersed high-expansion metal oxide dispersant in the enamel matrix is $$Z_{(1-2)}MO_{(3-4)},$$

wherein

Z=an alkali metal (Li, Na, K, Rb, Cs), Ba, or Mg
M=a Group IV–B metal (Ti, Hf, Zr), or Si
O=oxygen.

The dispersant in the enamel matrix is commonly an alkali metal titanate or zirconate, such as $Li_2TiO_3$ (preferred), $Na_2TiO_3$ or $Na_2ZrO_3$. Barium titanate, $Mg_2SiO_4$ (forsterite) and MgO (coefficient of expansion of 12.8 in./in./0° C.($\times 10^{-6}$) may also be used satisfactorily.

The enamel, which together with the foregoing metal oxide dispersant forms the coating composition of the present invention for protection of thermoelectric materials, must be compatible with the thermoelectric material and have a relatively low curing temperature (e.g., below about 1200° F.), in order not to degrade or otherwise damage the thermal and electrical properties of the thermoelectric material. It must also have a reasonable coefficient of thermal expansion to prevent its cracking or spalling due to differential expansion between it and the base thermoelectric material.

Generally satisfactory enamels are the coating compositions which have been developed for light metals such as aluminum. Such compositions have relatively high thermal expansion coefficients, corresponding with the high thermal expansion coefficients of aluminum (~23 in./in./0° C.($\times 10^{-6}$)). They can be matured at relatively low temperatures, which avoids impairing desirable metallurgical characteristics of the light metal, and yet provide suitable protection against the effects of such chemical reagents as seawater and alkalies. Coating compositions having these characteristics are disclosed in such references as U.S. Pat. 2,467,114 (Deyrup), the teachings of which are incorporated herein by reference. These enamels, which have a firing and curing temperature of about 920–980° F. (well below the high melting point of the metal oxide dispersant), contain as essential ingredients lead oxide, silica (optionally replaceable in part with $TiO_2$), lithium oxide, and at least one other alkali metal oxide taken from the group consisting of sodium oxide and potassium oxide. It should be noted, however, that such enamels, when employed alone, without the dispersant metal oxide, are found to be greatly inferior to the combination coating.

The following table discloses the composition and ranges of enamel frits having the foregoing general composition, which are especially satisfactory in the practice of the present invention.

TABLE

| | | Preferred composition (wt. percent) | |
|---|---|---|---|
| | Range | No. 1 | No.2 |
| $PbO$ | 30.0–51.0 | 50.4 | 35.4 |
| $SiO_2$ | 25.0–35.0 | 19.7 | 23.4 |
| $Li_2O$ | 1.5–3.5 | 2.8 | 2.0 |
| $Na_2O$ | 9.0–15.0 | 3.2 | 9.5 |
| $K_2O$ | 0–9.0 | 3.3 | 7.7 |
| $TiO_2$ | 0–16.0 | 15.4 | 8.1 |
| $Sb_2O_3$ | 0–3.0 | 2.5 | 1.8 |
| $B_2O_3$ | 0–5.0 | 0.2 | 4.0 |
| $ZrO_2$ | 0–2.0 | | |
| $CdO$ | 0–8.0 | | 8.1 |
| $BaO$ | 0–2.0 | 1.9 | |
| Trace impurities | Bal. | Bal. | Bal. |

Coating compositions are prepared and applied onto thermoelectric materials in accordance with the following general method. The components of the enamel are weighed, mixed, heated in a crucible until completely molten, in the range of about 900–1200° C., and then poured into water. The resulting frit particles are then dried and mixed with the dispersant metal oxide powders in a weight ratio of about 3–5 parts frit to 1 part of dispersant, a weight ratio of about 4 parts frit to 1 part dispersant being preferred. The metal oxide powders are fine, for example in the range of −300 to −400 mesh size. After mixing, the composition is thoroughly ground, for example by wet ball milling. Ball milling is continued until a fine suspension is obtained, which may be for a time period of about 5–20 hours. Other equivalent grinding methods known to the ceramic art may also be suitably employed. Suitable mill additions, such as silica-gel, boric acid, and others known to the art, may be added at this time to improve the suspension of the powders and give better adherence during the curing step.

The composition is then applied onto the thermoelectric surface in any satisfactory carrier medium, for example in aqueous or organic suspensions; a water suspension is preferred because of simplicity and suitability. Prior to coating, the thermoelectric material is inspected and degreased by either abrasion or with an organic solvent such as acetone. The coating suspension may be applied onto the thermoelectric material by any suitable means, including brushing, dipping, and spraying. Spraying is preferred because it is found that an adherent and evenly applied coating may be obtained in this manner. Nitrogen or other inert gases, at a pressure of about 40–50 p.s.i.g., are suitable propellants, but clean air may also be utilized. The thermoelectric elements are placed on a rotating spindle, in the direct rays of a heat lamp, and the spray directed thereagainst, which is operationally convenient and gives uniform coatings. The elements are rotated under the heat lamp until dry. The coating thickness may satisfactorily vary, depending on operational requirements. Coating thickness of about 0.5–5 mils are ordinarily satisfactory, while a thickness of about 3 mils is preferred. It may be necessary to repeat the application and drying steps several times to obtain a desired thickness, impermeability, and quality.

The coated elements are then further dried and cured in a furnace under an inert gas atmosphere, for example, flowing argon. The elements are first heated at a relatively low temperature to complete the drying, for example in the neighborhood of 200° F. for about 15–25 minutes, after which the coatings are cured at a temperature above the melting point of the glass frit, but below the melting points of the metal oxide powders and of the thermoelectric material. The metal oxide dispersant is thus not itself melted to form a new vitreous composition, but retains its form as hard grains distributed throughout the matrix of the enamel, which gives an opaque and crystalline appearance to the cured coating. Further, the resulting coating is more refractory than the original frit.

The precise curing conditions of temperature and time will vary in accordance with the formulation of the particular coating composition and the characteristics of the particular substrate thermoelectric material. It is found that a curing temperature of about 1000–1200° F. for a period of about 45–75 minutes in a flowing inert gas atmosphere is ordinarily satisfactory, while a curing temperature of about 1100° F. for 1 hour is preferred. A two-step curing cycle is found to produce notably smooth surfaces and superior results, with a first firing at about 1000° F. for ½ hour followed by ½ hour at 1125° F. The resulting coated elements are then furnace cooled in flowing gas until the temperature drops to the region of about 400° F., after which they are removed from the furnace.

The following examples are offered to illustrate the present invention in greater detail.

EXAMPLE I

Lead telluride thermoelectric elements, 0.660 in. diameter by 0.160 in. thick, were prepared for encapsulation by abrasive cleaning in a dry box using a high velocity stream of $Al_2O_3$. A frit was prepared having the following composition:

| | Wt. percent |
|---|---|
| $PbO$ | 50.4 |
| $SiO_2$ | 19.7 |
| $Li_2O$ | 2.8 |
| $Na_2O$ | 3.2 |
| $K_2O$ | 3.3 |
| $TiO_2$ | 15.4 |
| $Sb_2O_3$ | 2.5 |
| $B_2O_3$ | 0.2 |
| $BaO$ | 1.9 |
| Trace impurities | Balance |

This frit was thoroughly mixed with −325 mesh lithium titanate powder and other mill additions as follows:

| | Gms. |
|---|---|
| Frit | 1000 |
| Lithium titanate | 272 |
| Boric acid | 2.5 |
| Suspending agent (silica-gel) | 100 |
| Water | 400 |

This mixture was placed in a ball mill filled one-quarter full of flint balls and ground for about 20 hours. The resulting slip was sprayed onto the lead telluride elements which were in a jig rotated by a motor at 9 r.p.m. and heated under a heat lamp. A coating of about 1–2 mils thickness was obtained. After the encapsulant was so dried by the heat lamp, the coated elements were placed in the furnace, fired for 20 minutes at 200° F. in flowing argon, and then cured by heating for 1 hour at 1100±10° F. in flowing argon. The elements were then furnace cooled to 400° F. in flowing argon and removed from the furnace for inspection and testing.

The coatings were smooth, uniform and adherent, of a generally opaque or crystalline appearance. The elements showed no weight loss over a test period of 500 hours at 900° F. in a high vacuum, from which it was calculated that such elements could reach about 10,000 survival hours with no more than a 5 percent weight loss. There were no significant changes in either Seebeck voltages or thermal conductivity, and none of the coatings showed any cracks after testing.

EXAMPLE II

The procedure of Example I is followed to produce similarly satisfactory results, except that the thermoelectric material is bismuth telluride, the metal oxide powder is $Na_2ZrO_3$, and the enamel frit had the following composition:

| | Wt. percent |
|---|---|
| PbO | 35.4 |
| $SiO_2$ | 23.4 |
| $Li_2O$ | 2.0 |
| $Na_2O$ | 9.5 |
| $K_2O$ | 7.7 |
| $TiO_2$ | 8.1 |
| $Sb_2O_3$ | 1.8 |
| $B_2O_3$ | 4.0 |
| CdO | 8.1 |
| Trace impurities | Balance |

The foregoing examples are illustrative of the present invention and should not be considered restrictive thereof. Changes in coating composition and application methods may be made as required for particular applications and by differing thermoelectric substrates, which would still be within the realm of the disclosed invention. Therefore, the present invention should be understood to be limited only as is indicated in the accompanying claims.

What is claimed is:

1. An article comprising a thermoelectric material having a protective enamel coating comprising
   (a) a high thermal expansion metal oxide,
   (b) an enamel matrix, wherein said metal oxide is dispersed,
   (c) the metal oxide having a thermal coefficient of expansion of at least about 10 in./in./° C. ($\times 10^{-6}$) and the general formula $Z_{(1-2)}MO_{(3-4)}$, wherein
      Z=an alkali metal, Ba or Mg,
      M=a Group IV-B metal, Si, and
      O=oxygen, and (d) the enamel consisting essentially of about:

| | Wt. percent |
|---|---|
| Pbo | 30.0–51.0 |
| $SiO_2$ | 25.0–35.0 |
| $Li_2O$ | 1.5–3.5 |
| $Na_2O$ | 9.0–15.0 |
| $K_2O$ | Up to 9.0 |
| $TiO_2$ | Up to 16.0 |
| $Sb_2O_3$ | Up to 3.0 |
| $B_2O_3$ | Up to 5.0 |
| $ZrO_2$ | Up to 2.0 |
| CdO | Up to 8.0 |
| BaO | Up to 2.0 |
| Trace impurities | Balance |

2. The article of claim 1 wherein the thermoelectric material is lead telluride.

3. A method of providing a protective coating on a thermoelectric material, which comprises
   (a) providing a frit having the composition of about

| x | Wt. percent |
|---|---|
| Pbo | 30.0–51.0 |
| $SiO_2$ | 25.0–35.0 |
| $Li_2O$ | 1.5–3.5 |
| $Na_2O$ | 9.0–15.0 |
| $K_2O$ | Up to 9.0 |
| $TiO_2$ | Up to 16.0 |
| $Sb_2O_3$ | Up to 3.0 |
| $B_2O_3$ | Up to 5.0 |
| $ZrO_2$ | Up to 2.0 |
| CdO | Up to 8.0 |
| BaO | Up to 2.0 |
| Trace impurities | Balance |

(b) providing powders of a metal oxide dispersant having a coefficient of thermal expansion of at least about 10 in./in./° C.($\times 10^{-6}$),
   (c) mixing said frit and said powder and forming a suspension thereof,
   (d) applying the resulting suspension onto the thermoelectric material, and
   (e) curing the resulting coating composition at a temperature above the melting point of the frit but below the melting points of the thermoelectric material and of the metal oxide dispersant in an inert gas atmosphere.

4. The method of claim 3 wherein the coating is cured at a temperature below about 1200° F.

5. The method of claim 3 wherein the metal oxide dispersant has the general formula $Z_{(1-2)}MO_{(3-4)}$, wherein
   Z=an alkali metal, Ba or Mg,
   M=Group IV-B metal or Si, and
   O=oxygen.

6. The method of claim 3 wherein the coating composition consists essentially of about:

| | Wt. percent |
|---|---|
| PbO | 50.4 |
| $SiO_2$ | 19.7 |
| $Li_2O$ | 2.8 |
| $Na_2O$ | 3.2 |
| $K_2O$ | 3.3 |
| $TiO_2$ | 15.4 |
| $Sb_2O_3$ | 2.5 |
| $B_2O_3$ | 0.2 |
| BaO | 1.9 |
| Trace impurities | Balance |

7. The method of claim 3 wherein the metal oxide dispersant is selected from the class consisting of lithium titanate, sodium titanate, barium titanate, sodium zirconate, magnesium silicate, and magnesium oxide.

8. A method of applying a protective coating on a thermoelectric material which comprises (a) providing a frit from the class having compositions consisting essentially of about:

| (i) | Wt. percent |
|---|---|
| PbO | 50.4 |
| $SiO_2$ | 19.7 |
| $Li_2O$ | 2.8 |
| $Na_2O$ | 3.2 |
| $K_2O$ | 3.3 |
| $TiO_2$ | 15.4 |
| $Sb_2O_3$ | 2.5 |
| $B_2O_3$ | 0.2 |
| BaO | 1.9 |
| Trace impurities | Balance |

and

| (ii) | Wt. percent |
|---|---|
| PbO | 35.4 |
| $SiO_2$ | 23.4 |
| $Li_2O$ | 2.0 |
| $Na_2O$ | 9.5 |
| $K_2O$ | 7.7 |
| $TiO_2$ | 8.1 |
| $Sb_2O_3$ | 1.8 |
| $B_2O_3$ | 4.0 |
| CdO | 8.1 |
| Trace impurities | Balance |

(b) providing powders of a metal oxide dispersant selected from the class consisting of lithium titanate, sodium titanate, barium titanate, sodium zirconate, magnesium silicate, and magnesium oxide, (c) mixing said frit and said dispersant in a weight ratio of about 1 part dispersant to about 4 parts frit, (d) forming an aqueous suspension of the resulting mixture, (e) applying the suspension onto the thermoelectric material, and (f) firing and maturing the coating in an inert gas atmosphere at a temperature of about 1000–1200° F. for a period of about 45–75 minutes.

9. The method of claim 8 wherein (a) the thermoelectric material is lead telluride, (b) the metal oxide dispersant is lithium titanate, and (c) the firing is conducted for a period of about 1 hour at a temperature of about 1100° F.

References Cited

FOREIGN PATENTS

| | | | |
|---|---|---|---|
| 723,334 | 12/1965 | Canada | 117—201 |
| 710,711 | 6/1954 | Great Britain | 106—49 |
| 724,374 | 2/1955 | Great Britain | 106—49 |

REUBEN EPSTEIN, Primary Examiner

U.S. Cl. X.R.

106—49; 117—224; 136—201